United States Patent [19]

Ogasawara et al.

[11] 4,275,941

[45] Jun. 30, 1981

[54] SECURITY DEVICE FOR OPERATION PANEL

[75] Inventors: Tsutomu Ogasawara; Kazuo Enomoto, both of Ebina, Japan

[73] Assignee: Fuji Xerox Co., Ltd., Tokyo, Japan

[21] Appl. No.: 3,821

[22] Filed: Jan. 16, 1979

[30] Foreign Application Priority Data

Jan. 27, 1978 [JP] Japan .............................. 53/9453[U]

[51] Int. Cl.[3] ........................ H05K 5/02; A47B 96/00

[52] U.S. Cl. .................................... 312/223; 312/319; 174/52 R

[58] Field of Search ............... 312/223, 204, 312, 209, 312/319, 320, 234.5; 174/52 R

[56] References Cited

U.S. PATENT DOCUMENTS

| | | | |
|---|---|---|---|
| 735,312 | 8/1903 | Stokes | 312/312 |
| 2,215,462 | 9/1940 | Davidson, Jr. et al. | 312/223 |
| 2,525,164 | 10/1950 | Ackles | 312/312 |
| 2,768,047 | 10/1956 | Strauss | 312/320 |
| 2,979,554 | 4/1961 | Maitland | 174/52 R |
| 3,112,968 | 12/1963 | Cotton et al. | 312/223 |
| 3,272,978 | 9/1966 | Jackson | 174/52 R |
| 3,349,233 | 10/1967 | Angier | 174/52 R |
| 3,717,319 | 2/1973 | Schultz et al. | 312/320 |
| 3,770,334 | 11/1973 | Weber | 312/223 |
| 4,027,096 | 5/1977 | Waddington et al. | 174/52 R |

*Primary Examiner*—Victor N. Sakran
*Attorney, Agent, or Firm*—Sughrue, Rothwell, Mion, Zinn and Macpeak

[57] ABSTRACT

A device for securing an operation panel on an office machine such as a copier or the like where the parts to be engaged between the operation panel and the machine frame are arranged symmetrically relative to a rotating axis of the operation panel. Electrical wiring extending from the interior of the machine to the operation panel are provided with sufficient lengths, so that the operation panel can be secured to the machine frame in either of two positions rotated from one each other through an angle of 180°. The engagement between the operation panel and the machine frame is of a snap or a slide latch type of coupling.

6 Claims, 7 Drawing Figures

SECURITY DEVICE FOR OPERATION PANEL

BACKGROUND OF THE INVENTION

This invention generally relates to an improvement in the operability of machines such as facsimile, copying machines and the like, and more particularly to a device for changing position of an operation panel of the machine in accordance with the installed position of the machine.

Operation panels of conventional construction are provided with switches, dials, indicators, and the like have been secured fixedly to the respective machines generally on top surfaces of the device. Therefore in some installation conditions, the characters and the like indicated on the operation panel are apt to be obscured or viewed by the operator upside down. The panels are fixed to the frame and no alternative positioning is possible without a complete redesign of the device.

FIGS. 1 and 2 are schematic views explaining the above described features of this invention. Walls 4 define a business room 3 having generally therein a desk 1 and a chair 2 for the operator. In the situation where a copying machine or the like 5 is located along the wall 4 as indicated by a one-dot chain line, the operator sitting on the chair 2 will see the switches 8 and the like on the operation panel 6 correctly from the front side of the machine (in the arrow direction) as shown in FIG. 2(A). However, when the machine 5 is located as indicated by the solid line, for instance, at a side of the desk 1, the operation panel 6 previously arranged on the machine to be seen from the front side thereof (in the arrow direction) is observed from the operating position (on the chair 3) inversely as shown in FIG. 2(B). The result that the recognition of various indications and switches 8 on the panel 6 is made difficult since the operator will be unable to immediately recognize the indicator signal. The result is a tendency toward giving rise to erroneous operation of the equipment.

Accordingly it is an object of the present invention to provide a device where the orientation of an operation panel secured to the machine frame can be altered easily, and the above described drawbacks of the conventionally secured operation panel can be thereby eliminated.

It is another object of this invention to provide a device for rotating the position of an operation panel that does not interfere with the overall construction and operation of the system.

These and other objects are attained by means of an operating panel located on an office machine having connection arranged symmetrically relative to a rotating axis of the operation panel. The internal wiring extends in a sufficient length so that the panel can be rotated and secured at positions 180° apart.

DESCRIPTION OF THE PREFERRED EMBODIMENT

Figure 3:
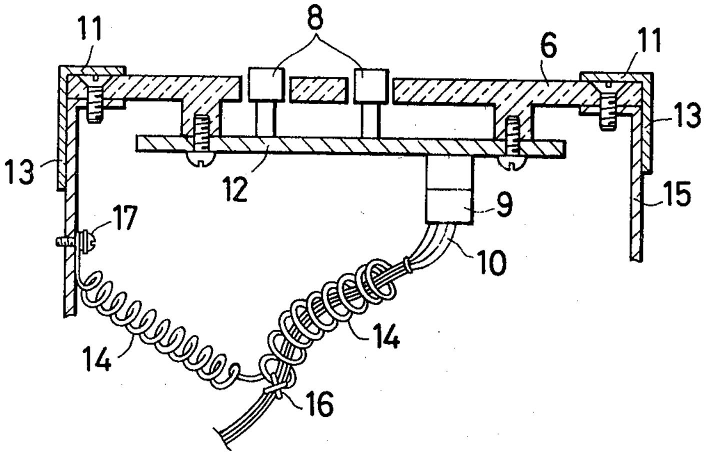
FIG. 3 is a sectional side view of an example of the invention.

Referring now to FIG. 3 an embodiment of the invention in section is shown. The operation panel 6 is secured to a frame 15 of a machine 5 by means of screws 11. The panel is placed on a top surface of the device. Flanges or outer covers 13 overlie both ends of the operation panel 6 and a plate 12 is secured to the rear side of the operation panel 6 for mounting the switches 8 and the like. The switches mounted on the plate 12 and the operating parts thereof appear on the front surface of the operation panel 6 to provide visual indirections of machine status or operation.

A connector 9 connects the wiring 10 in the machine 5 with the switches 8. The internal wiring 10 is bundled by the use of a cable tie 16 so that none of the wiring is separated and the outside of the cable tie is protected by winding thereon a coil spring 14. The coil spring 14 and the wiring 10 are fixed at one appropriate position so that flexibility and resilience are rendered to the wiring 10.

One end of the spring 14 is secured to the machine frame 15, for instance, by a suitable fastener 17 such as a scew, rivet or the like. Direct application of forces to the wiring 10 is thereby prevented. The internal wiring 10 is provided with sufficient length for turning the operation panel 6 through 180° around a line perpendicular to the surface of the operation panel. This line is shown in FIG. 3. The engaging parts (positions of the screws 11) between the operation panel 6 and the frame 15 are arranged symmetrically around the aforementioned line around which the operation panel 6 is turned.

Figure 1:
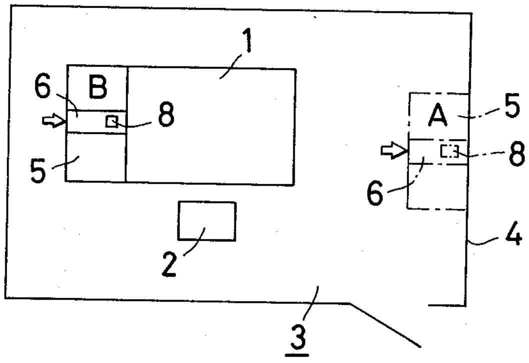
FIG. 1 is a schematic plan view showing the installed status of the machine.
Figure 2A:
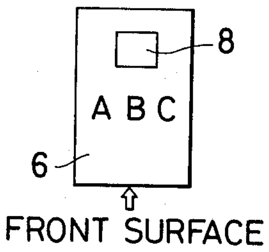
FIG. 2(A) and (B) indicates views of a line of sight by an operator of the operation panel when the machine is located at two different positions as in FIG. 1.
Figure 2B:
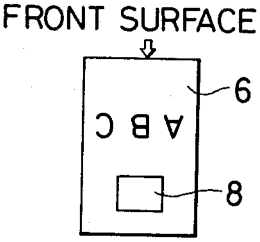

Since the invention is arranged so that, when the machine 5 is relocated as described before with reference to FIG. 1, to a position where the operation panel 6 is seen by the operator upside down, the outer flanges 13 and the screws 11 may be removed temporarily and the operation panel 6 may be rotated around the line perpendicular thereto through 180°. As a result, the display will appear in a readable fashion to the operator.

Figure 4:
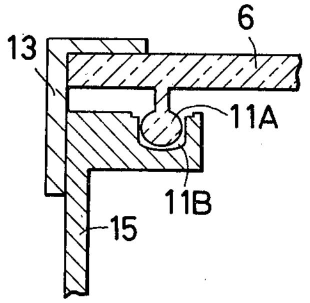

In place of the screws 11, a snap type engagement as shown in FIG. 4 may be used. Spherical projections 11A seizable in spherical recesses 11B on a part of the frame 15 may be used for securing the operation panel 6 onto the frame 15. This is an advantageous feature requiring no tools.

Figure 5:
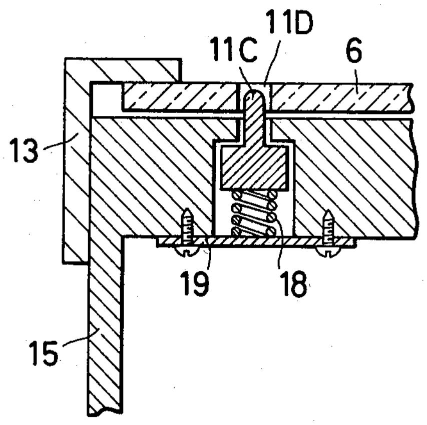
FIGS. 4, 5 and 6 indicate various examples of the engaging devices between the operation panel and the machine frame.

FIG. 5 shows in section another example of the engagement between the operation panel 6 and the machine frame 15. A pin 11C is inserted in a hole provided in the frame 15 and biased by a spring 18 and a securing plate 19 to project upwardly. A hole 11D provided through the operation panel 6 receives the end of the pin 11C. With the pin 11C and the hole 11D, an engagement of a slide latch type can be obtained between the operation panel 6 and the machine frame 15.

Figure 6:
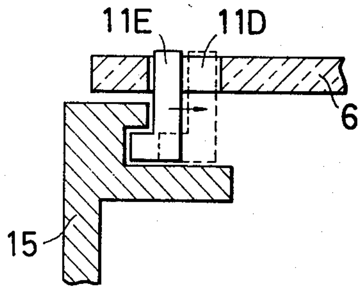

In FIG. 6, another example of the slide latch type engaging procedure between the operation panel 6 and the machine frame 15 is shown. In this example, the operation panel 6 is secured to the machine frame 15 by a slidable piece 11E freely slidably received in a hole 11D provided through the operation panel 6 and biased by a spring or the like to a locked position, that is inverse to the arrow marked direction. By sliding the sliding piece 11D in the arrow direction against the force of the spring to the position indicated by a broken line, the operation panel 6 can be removed from the machine frame 15 for the purpose of being secured again to the machine frame in the reversed orientation.

In all of the above described examples, the internal wiring 10 is given sufficient lengths, and the engaging positions between the operation panel 6 and the machine frame 15 are provided symmetrically to a line around which the operation panel 6 is be rotated.

While the invention has been described with respect to use in an office machine, it is apparent that the concept may be employed in any machine where the viewing angle is changeable.

We claim:

1. A device for securing an operation panel on a machine comprising: means engaging the operation panel and the machine frame to secure the panel to the frame, said engaging means arranged symmetrically relative to a rotating axis of the operation panel, and electrical wiring extending from the interior of the machine to the operation panel said wiring being provided with a length sufficient to allow the operation panel to be rotated with respect to, and secured to the machine frame in either of two positions disposed from one another through an angle of 180°, without disconnecting said wiring from said panel, and wherein said means for engagement between said operation panel and said machine frame comprises at least a pair of fastening means located about the periphery of said plate and said panel and extending between said plate and said panel, said fastening means being operable to releasably secure said panel to said frame.

2. A device as set forth in claim 1 wherein the fastening means between the operation panel and the machine frame comprises a pair of snap type fasteners, each having a recess fixed on said frame and a protrusion with an end portion mounted on said panel for engaging said recess.

3. A device as set forth in claim 1, wherein said fastening means between the operation panel and the machine frame comprises a slide latch, said frame having a recess portion, said latch being mounted on said panel for sliding engagement with said recess, said latch being biased by spring means to a normally latched position.

4. The device as set forth in claim 1 wherein the fastening means comprises a plurality of screws symmetrically disposed on said panel and projecting therethrough for engagement with said frame.

5. The device as set forth in claim 1 wherein the fastening means comprises a pin mounted in said frame, spring means to bias said pin in the direction of said panel and, a recess on said panel positioned to engage said pin.

6. The device of claims 1, 2, 3, 4, or 5 further comprising spring means mounted on said frame and coupled to said electrical wiring to render said wiring resilient, said spring means covering over a portion of said electrical wiring.

* * * * *